United States Patent

Halstead

[15] 3,640,519

[45] Feb. 8, 1972

[54] HANDLING AND HEAT-DISSIPATING DEVICE FOR ELECTRICAL COMPONENTS

[72] Inventor: William M. Halstead, P. O. Box 881, Glen Burnie, Md. 21061

[22] Filed: Aug. 13, 1969

[21] Appl. No.: 849,831

[52] U.S. Cl. ..........269/254, 24/259 FC
[51] Int. Cl. ..........G03d 13/10
[58] Field of Search ..........269/254; 24/261 C, 259 FC, 24/259 MC

[56] References Cited

UNITED STATES PATENTS

| | | | |
|---|---|---|---|
| 358,675 | 3/1887 | Kenyon et al. | 24/259 FC UX |
| 1,779,442 | 10/1930 | Mueller | 24/261 C UX |
| 2,539,581 | 1/1951 | Holden | 269/254 X |

*Primary Examiner*—William S. Lawson
*Assistant Examiner*—Z. R. Bilinsky
*Attorney*—Munson H. Lane and Munson H. Lane, Jr.

[57] ABSTRACT

A pair of platelike metallic jaws are secured to a resilient clamp which urges the jaws in engagement with sets of metallic terminals at opposite sides of electrical components such as integrated circuit modules, so that when lead wires of the terminals are soldered or unsoldered, heat is dissipated by the jaws and clamp to prevent damage of the component by excessive heat. The clamp also provides a handle for the device, so that the component held between the jaws may be conveniently manipulated during installation or removal.

6 Claims, 4 Drawing Figures

PATENTED FEB 8 1972 3,640,519

INVENTOR
William M. Halstead

BY Munson H. Lane
ATTORNEYS

HANDLING AND HEAT-DISSIPATING DEVICE FOR ELECTRICAL COMPONENTS

This invention relates to new and useful improvements in special tools for use in the electronic industry, an in particular the invention concerns itself with a device which is especially intended for use with electrical components such as integrated circuit modules which are provided at their opposite sides with sets of terminals having lead wires for soldered connections to a printed circuit board.

Although such components are usually located on one side of the printed circuit board and the soldered connections of the lead wires are made at the other side, the soldering or unsoldering operation produces sufficient heat which is conducted by the lead wires through the board to the terminals of the component and the latter often sustains permanent damage by excessive heat.

The principal object of the invention is to avoid heat damaging of the components during soldering or unsoldering operations, this being achieved by the provision of a clamplike device having a pair of metallic jaws between which a component may be held with the terminals of the component engaging the jaws so that heat incident to soldering operations is transferred by conductivity to the jaws and to the clamp which carries the jaws, thus affording an effective dissipation of heat and safeguarding the component against heat damage.

Another important feature of the invention is that the clamp which carries the jaws also serves as a convenient handle for the device and permits the component held by the jaws to be properly supported and manipulated while it is being applied to or removed from a printed circuit board.

Other objects and features of the invention will become apparent from the following description taken in conjunction with the accompanying drawings, wherein like characters of reference are used to designate like parts, and wherein.

Figure 1:
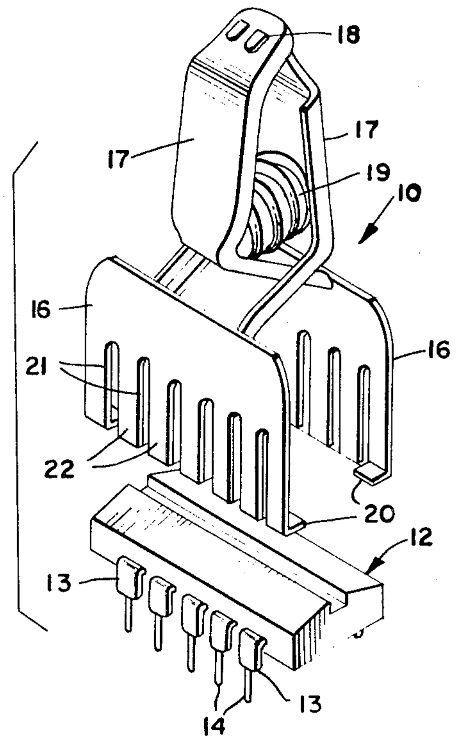
FIG. 1 is a group perspective view showing the device of the invention and a typical electrical component with which the device is intended to be used.

Referring now to the accompanying drawings in detail, the numeral 10 designated one embodiment of a handling and heat-dissipating device of the invention, the same being especially intended for use on an electrical component such as an integrated circuit module 12 which is provided at its opposite sides with sets of metallic terminals 13 having wire leads 14 extending downwardly therefrom. The component 12 is usually placed on one side of a circuit board 15 and the wire leads 13, after being passed through apertures in the board, are soldered to a printed circuit on the other side of the board. Although the soldering operation takes place at the side of the board opposite from the component 12, the resulting heat is conducted by the wire leads through the board to the terminals 13 of the component. Inasmuch as these components are heat sensitive and have a maximum allowable operating temperature, they often become permanently damaged by excessive heat resulting from soldering or unsoldering, when the components are applied to or removed from the board.

The device 10 of the invention eliminates this heat damage of the components by affording adequate dissipation of heat during the soldering operation. As such, the device comprises a pair of coacting platelike jaws 16 which are made of material possessing good heat conducting properties, for example metal such as beryllium copper, although some other suitable material may be used.

Figure 2:
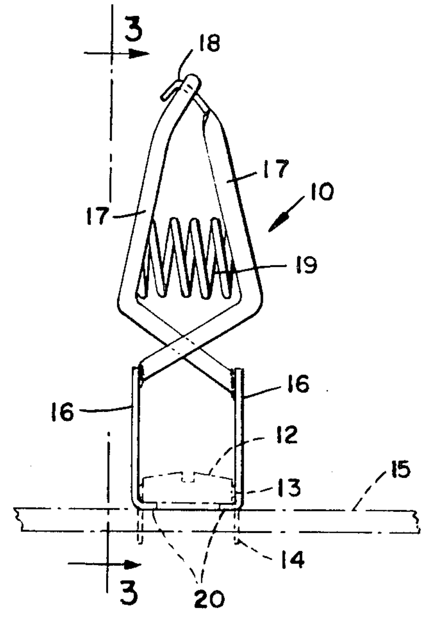
FIG. 2 is an elevational view of the device, applied to a component shown by dotted lines on a printed circuit board.
Figure 3:
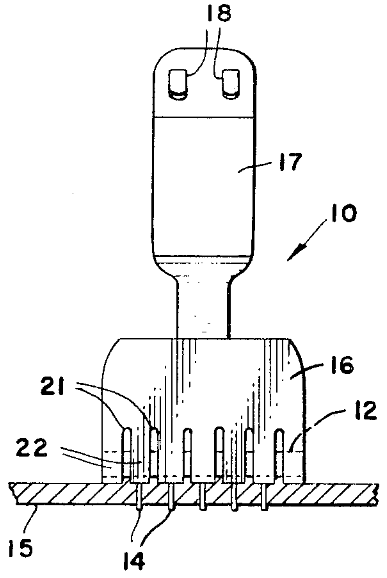
FIG. 3 is an elevational view, taken substantially in the plane of the lines 3–3 in FIG. 2.
Figure 4:
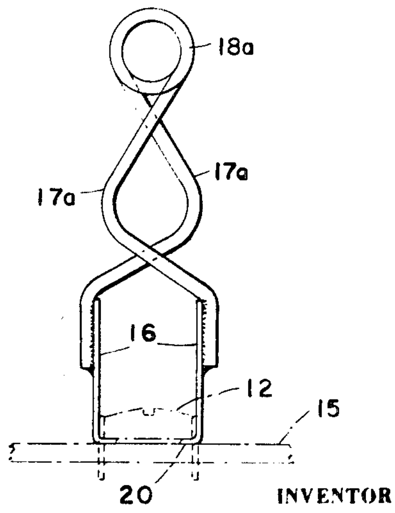
FIG. 4 is an elevational view, similar to FIG. 2, but showing a modified embodiment of the device.

The jaws 16 are carried by a resilient clamp which in the embodiment of FIGS. 1–3 is typically shown as comprising a pair of crossed arms 17 which are fulcrummed together at one end thereof as at 18, while at their other end the crossed arms are suitably secured to the respective jaws 16. A compression spring 19 is interposed and reacts between the crossed arms 17 so as to urge the jaws 16 toward each other. In a slightly modified embodiment shown in FIG. 4 the clamp is made from a single length of spring wire, shaped to provide a pair of crossed arms **17*a* to which the jaws 16 are secured and a coiled portion 18*a* which connects the arms 17*a*** together and biases the jaws toward each other.

In either of the two disclosed embodiments the component 12 is adapted to be received and releasably held between the jaws 16 so that the jaws are in engagement with the component terminals 13. Accordingly, when soldering operations are performed at the wire leads 14 and heat therefrom is conducted to the terminals 13, such heat will be conductively transferred to the jaws 16 and to the associated clamp by which the jaws are carried, so that adequate dissipation of heat will take place and the component 12 will be protected against excessive heat damage.

The jaws 16 are preferably provided at their lower edges with inturned portions 20 constituting seats for the underside of the component 12, whereby to assist in holding the component between the jaws by preventing the component to slip downwardly. In this connection it is to be noted that the clamp of the device, including the arms 17 or **17*a*, constitutes a convenient handle for the device as a whole, whereby the component 12 between the jaws 16 may be easily held and manipulated during its installation on or removal from the board 15**.

It will be also noted that the jaws 16 are provided with slots 21 extending upwardly from the lower edge of the jaws. These slots separate each jaw into a set of spaced-apart fingers which are individually engageable with the respective terminals 13 of the component 12, and the spaces or slots 21 between these fingers further assist in the dissipation of heat from the terminals and jaws. Moreover, the separate fingers assure proper thermally conductive contact with the several terminals, which would not necessarily obtain if the jaws were of a solid or unslotted form.

What is claimed as new is:

1. For use on an electrical component which is provided at its opposite sides with sets of metallic terminals and lead wires projecting from said terminals below the component; a device for handling such a component and dissipating heat therefrom during performance of soldering operations on the lead wires, said device comprising a pair of coacting platelike jaws formed from heat conductive material formed and adapted to receive a component therebetween while engaging metallic terminals at the opposite sides of the component, and resilient clamp means secured to said jaws and biasing the same toward each other for releasably retaining the component between the jaws, said clamp means constituting a handle for the device, wherein said jaws have lower edges and are provided with slots extending upwardly from said lower edges whereby to separate each jaw into a set of spaced-apart fingers engageable with the respective terminals of the component.

2. The device as defined in claim 1 wherein said jaws have lower edges and are provided at said lower edges with inturned portions constituting seats engageable with the underside of the component.

3. The device as defined in claim 1 which is further characterized in that said clamp means are also formed from heat-conductive material.

4. The device as defined in claim 1 which is further characterized in that the heat-conductive material of said jaws comprises beryllium copper.

5. The device as defined in claim 1 wherein said clamp means comprise a pair of crossed arms fulcrummed together at one end thereof and secured to the respective jaws at their other end, and a spring reacting between said arms to urge said jaws toward each other.

6. The device as defined in claim 1 wherein said clamp means comprise a spring wire clamp having a pair of crossed arms and a coil portion connecting said arms together at one end so that the arms are urged together at their other end, said jaws being secured to said arms at said other end.